United States Patent [19]

Athanas

[11] 4,219,379
[45] Aug. 26, 1980

[54] METHOD FOR MAKING A SEMICONDUCTOR DEVICE

[75] Inventor: Terry G. Athanas, Lewisville, Tex.

[73] Assignee: Mostek Corporation, Carrollton, Tex.

[21] Appl. No.: 945,362

[22] Filed: Sep. 25, 1978

Related U.S. Application Data

[62] Division of Ser. No. 759,803, Jan. 17, 1977, abandoned.

[51] Int. Cl.² ........................................... H01L 21/306
[52] U.S. Cl. ..................................... 156/653; 29/571; 148/187; 156/657; 156/659.1; 156/662; 156/904; 357/23; 357/41; 357/59; 427/86; 427/93
[58] Field of Search ...................... 427/86, 87, 93–95; 156/653, 654, 655, 657, 659, 662, 904; 148/187; 29/571, 580, 591; 357/23, 41, 49, 53, 59, 91

[56] References Cited

U.S. PATENT DOCUMENTS

| 3,544,399 | 12/1970 | Dill ..................................... 156/657 X |
| 3,576,478 | 4/1971 | Watkins et al. .................. 148/175 X |
| 3,745,647 | 7/1973 | Boleky ................................ 29/571 |
| 3,865,654 | 2/1975 | Chang et al. .................. 29/571 X |
| 3,869,786 | 3/1975 | Adam et al. ......................... 29/571 |
| 3,911,168 | 10/1975 | Schinella et al. .................. 427/94 X |
| 3,913,211 | 10/1975 | Seeds et al. ........................ 29/571 |
| 3,921,283 | 11/1975 | Shappir .............................. 29/571 |
| 4,062,707 | 12/1977 | Mochizuki et al. .............. 427/86 X |

OTHER PUBLICATIONS

IBM Technical Disclosure Bulletin, vol. 15, No. 6, Nov. 1972, Fabricating Submicrometer Silicon Devices, by E. Bassous, pp. 1823–1825.
IBM Technical Disclosure Bulletin, vol. 15, No. 10, Mar. 1973, FET Integrated Circuit Having Two Polysilicon Layers, by S. A. Abbas, pp. 3022–3023.
IBM Technical Disclosure Bulletin, vol. 14, No. 4, Sep. 1971, Surface Protected Etching Technique for Silicon Gate FETs, by Jones et al., pp. 1052–1053.

Primary Examiner—William A. Powell
Attorney, Agent, or Firm—G. Roland Love

[57] ABSTRACT

A method for making a semiconductor device is described in which polycrystalline silicon is vacuum deposited and then converted to silicon dioxide thereby providing a number of advantages over direct deposition of silicon dioxide. The method has particular applicability to isoplanar MOSFET integrated circuit manufacturing.

3 Claims, 15 Drawing Figures

METHOD FOR MAKING A SEMICONDUCTOR DEVICE

BACKGROUND OF THE INVENTION

This is a division, of application Ser. No. 759,803, filed Jan. 17, 1977, now abandoned.

The present invention relates generally to semiconductor devices, and more particularly to metal-oxide-semiconductor field-effect transistors and related integrated circuit manufacturing techniques.

Prior art integrated circuit manufacturing techniques have employed silicon dioxide deposition in a number of areas, and particularly for purposes of masking silicon nitride. Formation of an oxide mask is typically achieved by selective etching using a photoresist mask of the same pattern desired for the oxide mask. Deposited silicon dioxide tends to contain hard particles, which makes it difficult to duplicate the good mask definition of the photoresist in the oxide. When a large number of silicon wafers undergo simultaneous silicon dioxide deposition, variations in thickness occur from wafer to wafer. Such variations necessitate an etch duration long enough to cut through the thickest oxide anticipated, which causes over etching of thinner oxide layers and consequently undesirable undercutting of the photoresist. Compounding such problems is the relatively fast etch rate of deposited silicon dioxide (compared to grown oxide, for example) which makes controlling the etch more difficult.

These and other problems of the prior art are eliminated or alleviated to a large degree by the present invention.

SUMMARY OF THE INVENTION

In accordance with the present invention, polycrystalline silicon (hereinafter referred to as "polysilicon") is deposited on a semiconductor device and then converted to silicon dioxide (hereinafter referred to as "polyoxide"). The polysilicon is preferably vacuum deposited in a hot wall furnace. The oxidation of the polysilicon preferably takes place in a moist oxidizing ambient at a temperature sufficient to convert the polysilicon layer to a polyoxide layer having the general characteristics of a thermal oxide grown directly on silicon. The polyoxide may, however, overlie surfaces other than silicon, as one important aspect of the invention is the creation of an oxidation mask by etching a pattern of an oxidation-resistant material through a polyoxide mask. One particular application of this important aspect of the invention involves the use of an oxidation mask of silicon nitride in the formation of an isoplanar field oxide which defines active areas in a semiconductor substrate. Polyoxide provides advantages over deposited silicon dioxide in that polyoxide has a slower etch rate and a more uniform thickness and composition compared to deposited silicon dioxide, thereby permitting better mask definition and resulting finer control in locating the field oxide and active areas therebetween.

An additional advantage of the present invention is the relatively low temperature at which a polyoxide layer may be created, which permits the formation of passivation and stabilization layers at temperatures which do not affect diffusion profiles in the semiconductor device.

Still another advantage of using polyoxide as opposed to deposited silicon dioxide is that a large number of wafers may be positioned vertically on edge and closely spaced in a boat for processing in a hot wall furnace as opposed to the lower volume cold wall arrangement typically used to deposit silicon dioxide. Additionally, the wafers conveniently remain in situ in the boat during subsequent oxidation of the wafers.

The novel features believed characteristic of the invention are set forth in the appended claims. The nature of the invention, however, as well as its essential features and advantages, may be understood more fully upon consideration of an illustrative embodiment, when read in conjunction with the accompanying drawings, wherein:

DESCRIPTION OF THE PREFERRED EMBODIMENTS

Figure 1:
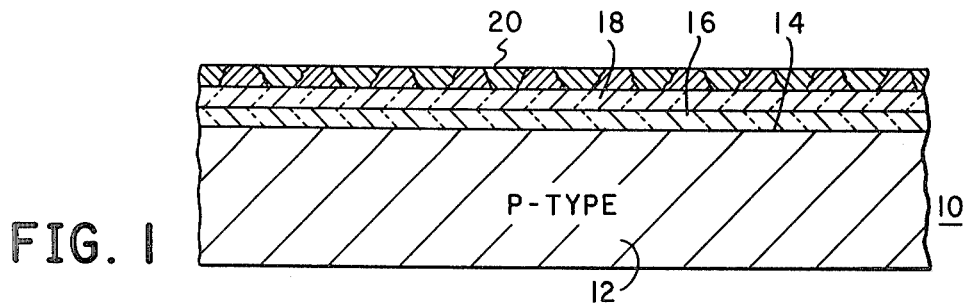
FIGS. 1-15 are schematic sectional views of a device of the present invention at various stages in a process for making the device.

Referring to FIG. 1, there is shown a schematic slice of a device of the present invention, indicated generally by the reference numeral 10, at an early stage in a manufacturing process. A silicon wafer of P-type conductivity, having a resistivity preferably of about 5 to 30 ohm-cm., is employed as a substrate 12. Grown on top surface 14 of the substrate 12 is a silicon dioxide layer 16, having a preferred thickness of about 600 Angstroms. A silicon nitride layer 18, having a thickness of about 650 Angstroms, is deposited on the silicon dioxide layer 16 using known cold wall or hot wall reactor techniques. A top layer 20 of polysilicon is deposited on silicon nitride layer 18 preferably in a hot wall furnace using known vacuum deposition techniques.

Figure 2:
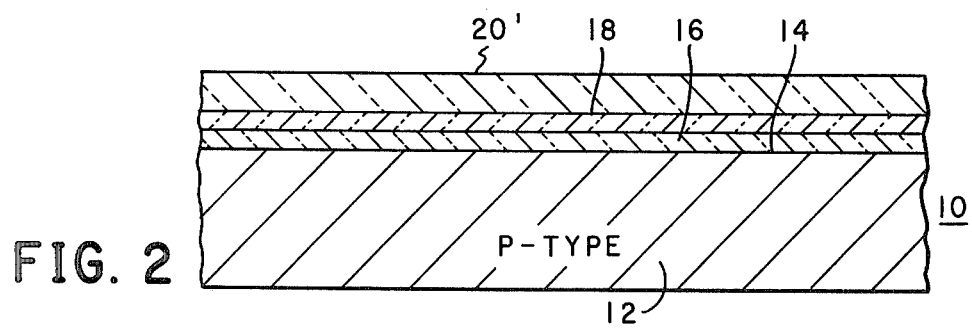

The device 10 is then exposed to an oxidizing ambient in steam preferably at about 950° C. for a sufficient period of time to completely oxidize the polysilicon layer 20 of FIG. 1, thereby producing a polyoxide layer 20' as shown in FIG. 2. The layer 20' is preferably about 2500 Angstroms in thickness, which is about twice the thickness of the original polysilicon layer 20 due to growth during oxidation.

Figure 3:
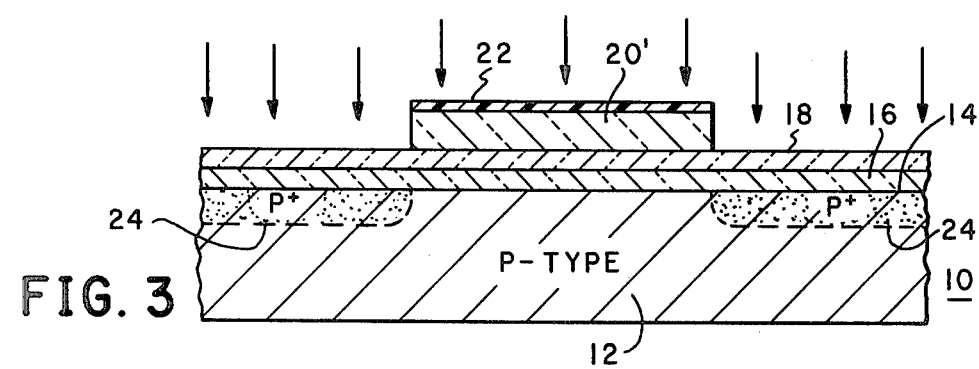

Referring to FIG. 3, a photoresist pattern 22 is deposited on polyoxide layer 20' using standard photomasking techniques, after which the unmasked portions of layer 20' are etched away. Following the etching step, an ion implant step is performed in a known manner as indicated by the arrows, preferably using boron which produces P+ regions 24 in the portions of the substrate 12 not covered by the polyoxide 20'. Isolated between regions 24 is the area where active elements will be formed in the device 10.

FIG. 3 illustrates an important feature of the presently described method wherein the resolution in defining the photoresist mask 22 is substantially reproduced in the polyoxide layer 20' by virtue of the controllability with which polyoxide can be etched. Undercutting of photoresist by lateral etching of the underlying oxide is a significant prior-art problem, which is greatly alleviated by the use of polyoxide as the material of layer 20'. The tendency to undercut the mask 22 by lateral etching of layer 20' is comparatively reduced since polyoxide can be etched with greater control than the deposited oxide used in the prior art. Such greater etch control is possible by virtue of the qualitative advantages of polyoxide over deposited oxide. Polyoxide has a slower etch rate, a more uniform thickness from wafer to wafer, and a relatively clean, particle-free composition.

Figure 4:
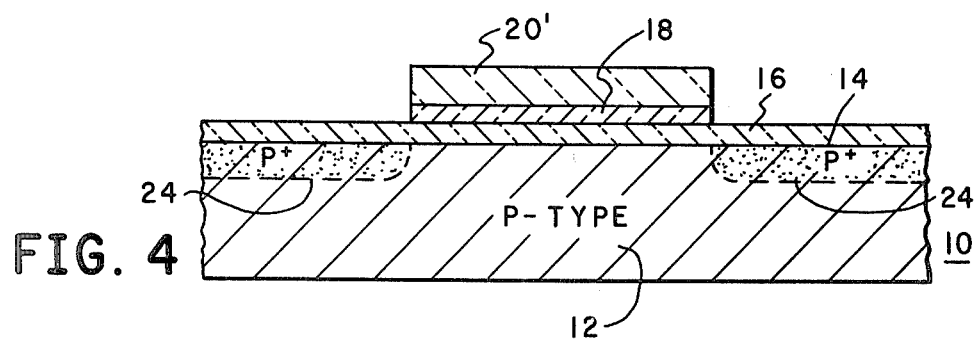

Next, the photoresist layer 22 is removed and the portions of the nitride layer 18 not covered by the polyoxide layer 20' are etched away to produce the structure of FIG. 4, using known techniques. Since the polyoxide layer 20' acts as a mask during the etching of nitride layer 18, a high degree of resolution is carried through in the structure of FIG. 4.

Figure 5:
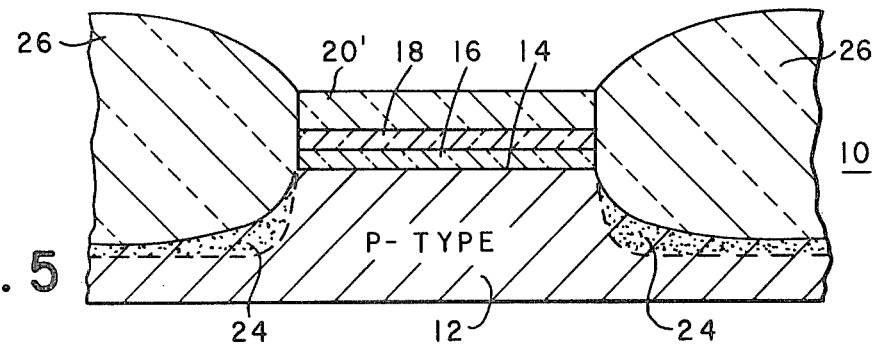

Now referring to FIG. 5, an isoplanar field oxidation is performed in steam for about 6 to 8 hours at approximately 1000° C., which results in a relatively thick "field" oxide layer 26, preferably about 13,000 Angstroms in thickness, being disposed around the stack of layers 16, 18 and 20'. The field oxide 26 penetrates into the substrate 12 to a depth of about 5000 Angstroms, driving the boron implant 24 to a greater depth therebelow. The field oxide 26 defines a region in the substrate 12 for forming an active element such as a MOSFET. Since the field oxide 26 is defined by the layer 18 comprising oxidation-resistant silicon nitride, it will be apparent that the controlled etching of polyoxide layer 20' is a determining factor in the achievement of precise substrate space allocation, thereby affecting not only yields but also element density in the substrate.

Figure 6:
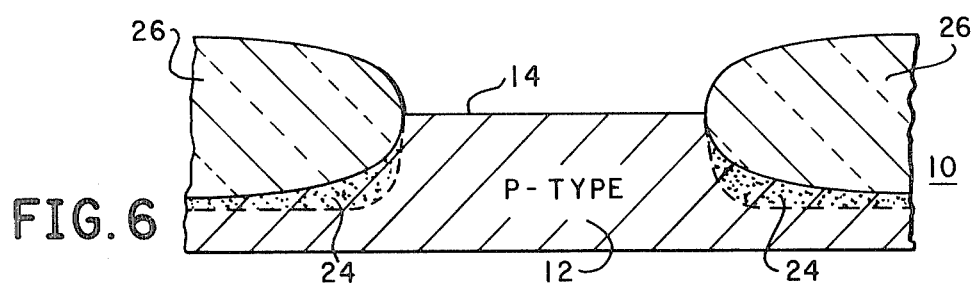

Next, the polyoxide layer 20' is removed by means of etching with hydrofluoric acid in a known manner, which also reduces the thickness of the field oxide 26. Then, the nitride layer 18 and oxide layer 16 are removed using conventional techniques, which produces the structure shown in FIG. 6. Incident to the removal of oxide layer 16, the thickness of the field oxide 26 is again reduced somewhat. As an alternative to the above sequence of steps, it may be advantageous to remove the polyoxide layer 20' prior to growing the field oxide 26, thereby limiting the etching of the field oxide 26.

Figure 7:
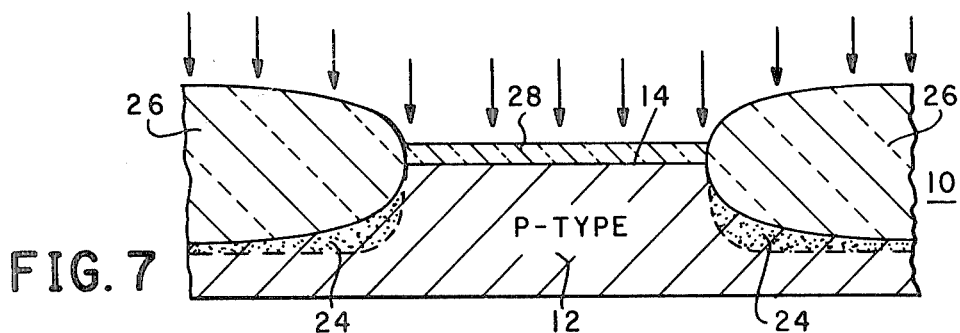

Following a surface cleaning step, a "channel" oxide or "gate" oxide layer 28 is grown to a thickness of about 900 Angstroms as shown in FIG. 7. This is followed by an ion implant step using known techniques. Either an enhancement mode or a depletion mode FET may be produced depending on the ion conductivity type and dosage level as described in U.S. Pat. No. 3,898,105, the terms of which are incorporated by reference herein.

Figure 8:
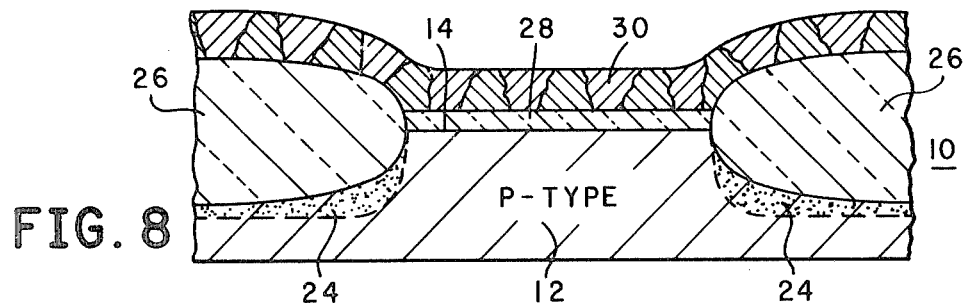

Now referring to FIG. 8, a polysilicon layer 30 is deposited on the channel oxide 28 to a thickness of about 5000 Angstroms using vacuum deposition in a hot wall furnace, similarly as described above in conjunction with layer 20 in FIG. 1. The polysilicon layer 30 will provide a means for forming a gate of a MOSFET by subsequent processing to be discussed below.

Figure 9:
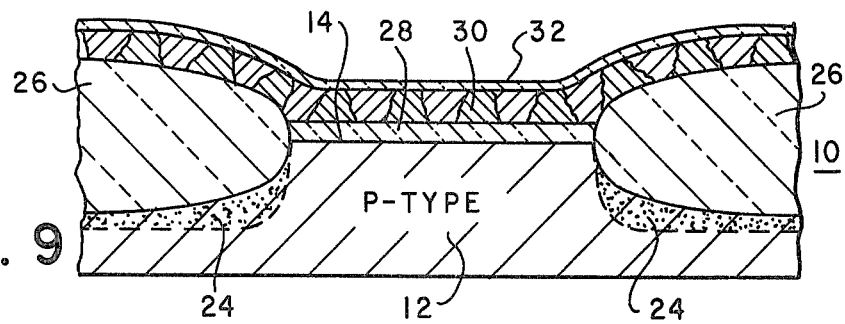

A partial oxidation of polysilicon layer 30 is then performed to produce a polyoxide layer 32 of about 700 Angstroms in thickness above the polysilicon layer 30 as shown in FIG. 9.

Figure 10:
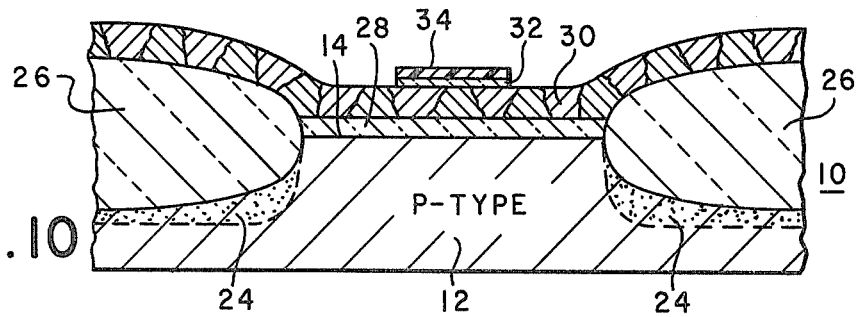

Next, a gate area is defined by a photoresist pattern 34, and the oxide layer 32 not covered by the photoresist 34 is etched away to produce the structure shown in FIG. 10.

Figure 11:
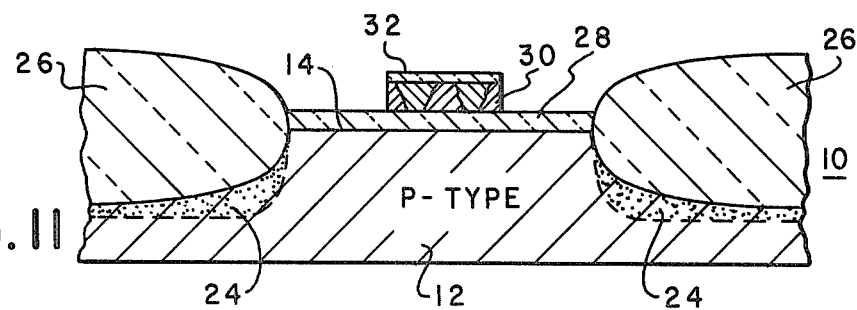

Now referring to FIG. 11, the photoresist 34 is removed, leaving the polyoxide layer 32 as a mask for etching the polysilicon 30 to produce the structure shown. Since both layers 32 and 30 may be controllably etched, good channel definition is achieved as will be apparent to those skilled in the art.

Figure 12:
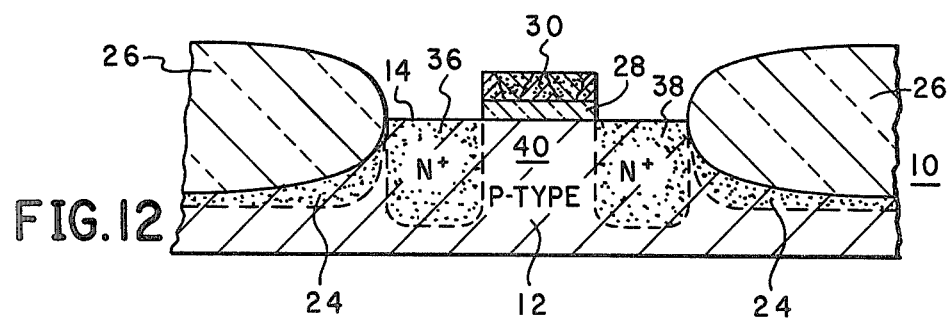

Next, an etch is performed which removes the polyoxide layer 32 and the portions of the oxide layer 28 not covered by the polysilicon 30, leaving a channel oxide strip 28 covered by a polysilicon strip 30. Thereafter, an N-type dopant, preferably phosphorus, is diffused using known techniques to produce N+ source and drain regions 36 and 38 in the substrate 12, which define channel region 40 in accordance with the structure of FIG. 12. The N+ regions 36 and 38 preferably have a resistivity of about 20 to 25 ohms/square. The phosphorus also diffuses into the polysilicon 30 (as indicated by the stippling), which causes layer 30 to be heavily doped N-type and thus highly conductive.

Figure 13:
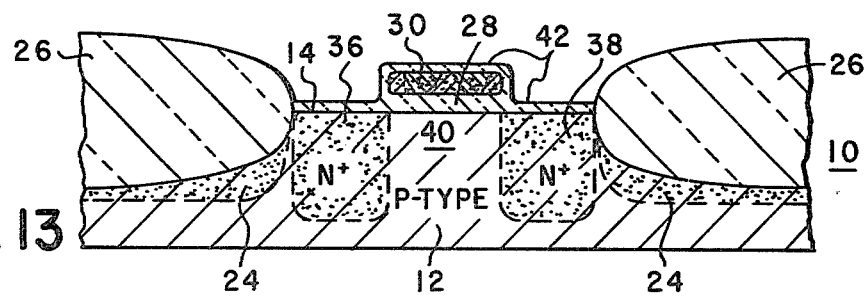

A thin, thermal oxide layer 42 is then grown as illustrated in FIG. 13. The oxide layer 42 is preferably grown in steam at about 950° C. to a thickness of about 700 Angstroms.

Figure 14:
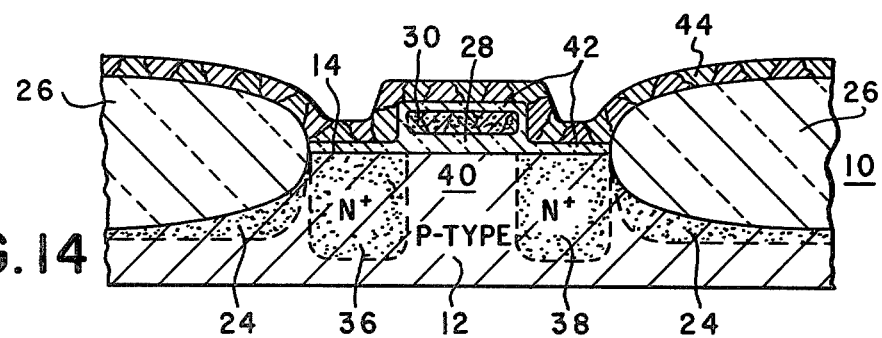

Now referring to FIG. 14, a layer 44 of polysilicon, preferably about 2500 Angstroms in thickness, is deposited using the same technique described above in conjunction with the formation of layers 20 and 30. Next, a doping step is performed to introduce a stabilizing material on all sides for the purpose of preventing impurities such as sodium from migrating into the underlying oxide layers, particularly the gate oxide 28. The doping step is preferably phosphorus diffusion, which readily enters polysilicon layer 44 without traversing the underlying oxide. Stabilization by phosphorus diffusion into silicon dioxide has been practiced in the prior art. Here it will be seen that a particular advantage of the present invention which greatly facilitates stabilization is that phosphorus diffuses at a much faster rate into polysilicon than into silicon dioxide.

The polysilicon layer 44 is then oxidized in steam at a temperature not exceeding 950° C., thereby producing a polyoxide stabilization layer 44', which expands to about 5000 Angstroms in thickness. A further advantage of the present invention is the relative speed with which N-doped polysilicon oxidizes. This relatively fast oxidation rate provides a favorable reduction in furnace time at this point in the process. Thereafter, contact windows are opened and metal source, drain and gate contacts 46, 48 and 50 are formed, preferably using aluminum deposition in a known manner to produce the structure shown in FIG. 15, which is referred to as a "silicon gate" structure. Due to the high conductivity of polysilicon layer 30, a gate signal applied to the contact 50 is carried by polysilicon layer 30, thereby modulating the channel 40 through oxide layer 28 in a manner known to those familiar with field-effect transistors. Polysilicon layer 30 may be located at a predetermined height above the channel 40 depending on the thickness of oxide layer 28.

Figure 15:
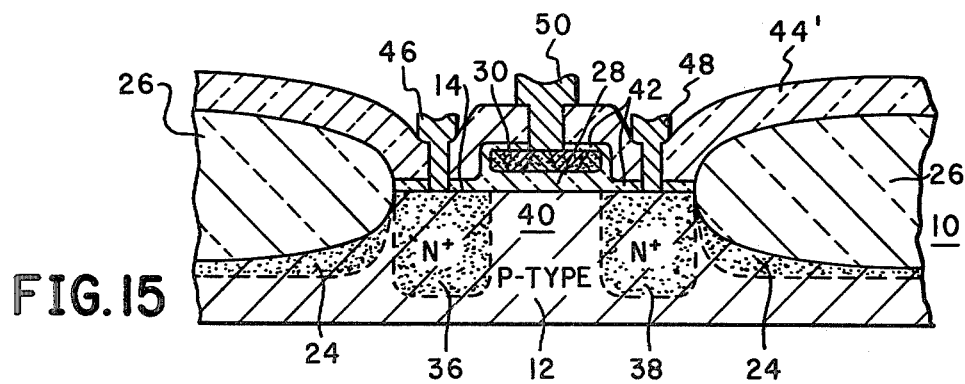

A particular advantage of the deposition and oxidation steps of FIGS. 14 and 15, is that the oxidation may be performed at a temperature low enough to prevent adverse alteration of the characteristics of the underlying regions of the device 10. For example, undesirable lateral diffusion of regions 36 and 38 is substantially averted by using the stabilization method of the present invention. While temperatures greatly in excess of 950° C. will cause undesirable lateral diffusion of impurities in regions 36 and 38, 950° C. is a sufficiently high temperature to convert polysilicon to a polyoxide having good thermal oxide characteristics.

Finally, a glassivation step is performed to environmentally passivate device 10 in a known manner. Preferably, a phosphorus stabilized glass layer is formed by depositing a phosphorus-doped oxide at a low temperature.

Although a preferred embodiment of the invention has been described in detail, it is to be understood that various changes, substitutions and alterations can be made therein without departing from the spirit and scope of the invention as defined by the appended claims. For example, while silicon has been designated as a preferred substrate material, other known elemental and compound semiconductor materials may be employed advantageously in certain applications; while the substrate 12 has been explicitly shown as P-type, a device having an N-type substrate may be produced by similar process steps as will be appreciated by those skilled in the art; while phosphorus and boron have been designated as preferred dopants, other known N-type and P-type dopants may be substituted therefor. These and other known variations of the above-described method of practicing the invention are within the scope of the claimed subject matter.

What is claimed is:

1. A method for accurately forming an oxidation mask comprising the steps:
   (a) forming a layer of an oxidation resistant material,
   (b) depositing a polysilicon layer on the oxidation resistant layer,
   (c) exposing the entire polysilicon to an oxidizing ambient to form a polyoxide layer,
   (d) exposing selected portions of the polyoxide to an acid etch to form a polyoxide mask, and
   (e) using the polyoxide mask to remove portions of the oxidation resistant layer to thereby form an oxidation mask for a layer beneath the oxidation resistant material.

2. The method of claim 2 used to accurately define an active area of a semiconductor substrate, wherein the oxidation resistant material comprises silicon nitride, and subsequent to step (e) the substrate is exposed to an oxidizing ambient whereby an isoplanar field oxide is grown around the silicon nitride oxidation mask.

3. The method of claim 3 wherein a thermal oxide layer is formed on the semiconductor substrate prior to step (a) and the silicon nitride is deposited on the thermal oxide layer.

* * * * *